(12) United States Patent
Itagaki et al.

(10) Patent No.: US 9,082,532 B2
(45) Date of Patent: Jul. 14, 2015

(54) CERAMIC ELECTRONIC COMPONENT (71) Applicant: Murata Manufacturing Co., Ltd., Nagaokakyo-shi, Kyoto-fu (JP)

(72) Inventors: Yoji Itagaki, Nagaokakyo (JP); Nobumichi Kimura, Nagaokakyo (JP); Tomoaki Matsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/453,880

(22) Filed: Aug. 7, 2014

(65) Prior Publication Data
US 2015/0054388 A1 Feb. 26, 2015

(30) Foreign Application Priority Data

Aug. 20, 2013 (JP) .................. 2013-170520
Jun. 3, 2014 (JP) .................. 2014-115097

(51) Int. Cl.
*H01F 27/29* (2006.01)
*H01C 7/00* (2006.01)
*H01G 4/228* (2006.01)
*H01L 41/047* (2006.01)
*H01G 4/30* (2006.01)
*H01L 41/083* (2006.01)
*H01F 27/28* (2006.01)

(52) U.S. Cl.
CPC ............ *H01C 7/008* (2013.01); *H01F 27/2804* (2013.01); *H01G 4/228* (2013.01); *H01G 4/30* (2013.01); *H01L 41/0472* (2013.01); *H01L 41/0477* (2013.01); *H01L 41/083* (2013.01)

(58) Field of Classification Search
CPC ........... H01F 27/28; H01F 27/29; H01F 5/00; H01L 2924/19105
USPC .................................. 336/192, 200; 361/305
See application file for complete search history.

(56) References Cited

U.S. PATENT DOCUMENTS

| 2002/0125547 | A1* | 9/2002 | Kawase et al. ................. 257/531 |
| 2004/0016110 | A1* | 1/2004 | Kawase .......................... 29/612 |
| 2012/0007709 | A1* | 1/2012 | Taniguchi et al. ............ 336/200 |
| 2012/0236462 | A1 | 9/2012 | Haruki et al. |
| 2012/0236463 | A1 | 9/2012 | Haruki et al. |
| 2014/0321025 | A1* | 10/2014 | Saito et al. ..................... 361/305 |

FOREIGN PATENT DOCUMENTS

| JP | 2004-288847 A | 10/2004 |
| JP | 2012-212860 A | 11/2012 |
| JP | 2012-212861 A | 11/2012 |

* cited by examiner

Primary Examiner — Tuyen Nguyen
(74) Attorney, Agent, or Firm — Keating & Bennett, LLP (57) ABSTRACT A ceramic electronic component includes an electronic component body and first and second metal terminals. The electronic component body includes a bare ceramic body and first and second outer electrodes. The first and second outer electrodes of the electronic component body are connected respectively to the first and second metal terminals by solders containing Sn as a main constituent. An alloy layer containing Ni—Sn is provided in at least a portion of a bonding interface between adjacent two of the first and second metal terminals and the first and second outer electrodes.

20 Claims, 10 Drawing Sheets

SECTION TAKEN ALONG A-A

FIG. 5

SECTION TAKEN
ALONG B-B

CERAMIC ELECTRONIC COMPONENT

BACKGROUND OF THE INVENTION

1. Field of the Invention

The present invention relates to a ceramic electronic component including a multilayer ceramic capacitor, for example.

2. Description of the Related Art

Recently, with quick progress toward smaller sizes and higher functionality of electronic components, downsizing of multilayer ceramic capacitors mounted to the electronic components has also been demanded. In the case of the multilayer ceramic capacitor, for example, a capacitor having a high electrostatic capacity and being replaceable with an aluminum electrolytic capacitor has been commercialized with development of the film thinning technology and the multilayer technology.

Figure 9:
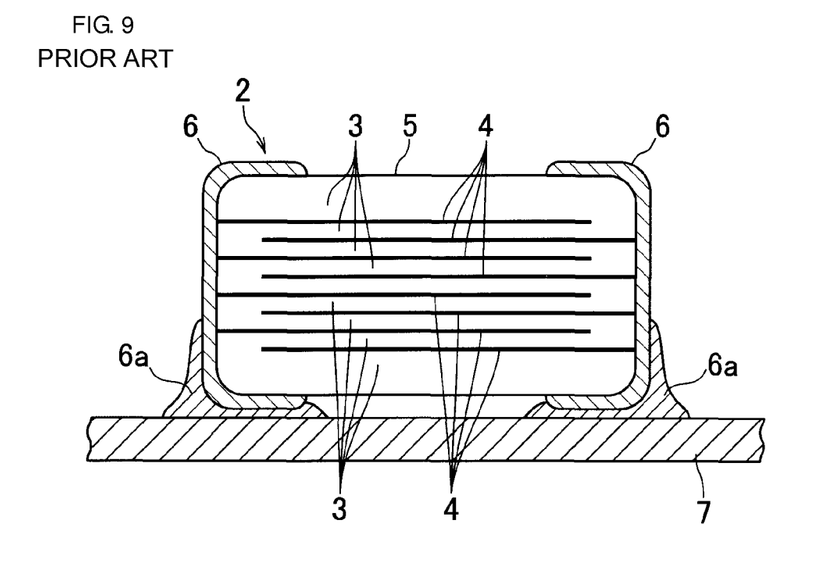
FIG. 9 is an explanatory view illustrating a state where a multilayer ceramic capacitor of related art is mounted to a mounting substrate.

As illustrated in FIG. 9, a multilayer ceramic capacitor 2 as a main body of an electronic component includes a bare ceramic body 5 in which a plurality of ceramic layers 3 and a plurality of inner electrodes 4 are alternately stacked. Adjacent ones of the plural inner electrodes 4 are alternately led out to opposing end surfaces of the bare ceramic body 5. Outer electrodes 6 electrically connected to the inner electrodes 4 are formed on the end surfaces of the bare ceramic body 5 to which the inner electrodes 4 are led out. With such a configuration, an electrostatic capacity is formed between the outer electrodes 6 disposed on the opposing end surfaces of the bare ceramic body 5. The multilayer ceramic capacitor 2 is mounted to a mounting substrate 7 by solders 6a for mounting. At that time, the outer electrodes 6 of the multilayer ceramic capacitor 2 are attached to the mounting substrate 7 by the solders 6a for mounting.

In the multilayer ceramic capacitor 2 described above, a ferroelectric material having a comparatively high dielectric constant, e.g., barium titanate, is generally used as the ceramic layers 3. However, because such a ferroelectric material exhibits the reverse piezoelectric effect, mechanical distortions occur in the ceramic layers 3 upon application of an AC voltage to the multilayer ceramic capacitor 2. When resulting vibration is transmitted to the mounting substrate 7 through the outer electrodes 6, there is a possibility that the mounting substrate 7 may become an acoustic radiation surface in its entirety and noisy vibration sounds (acoustic noises) may generate.

Figure 10:
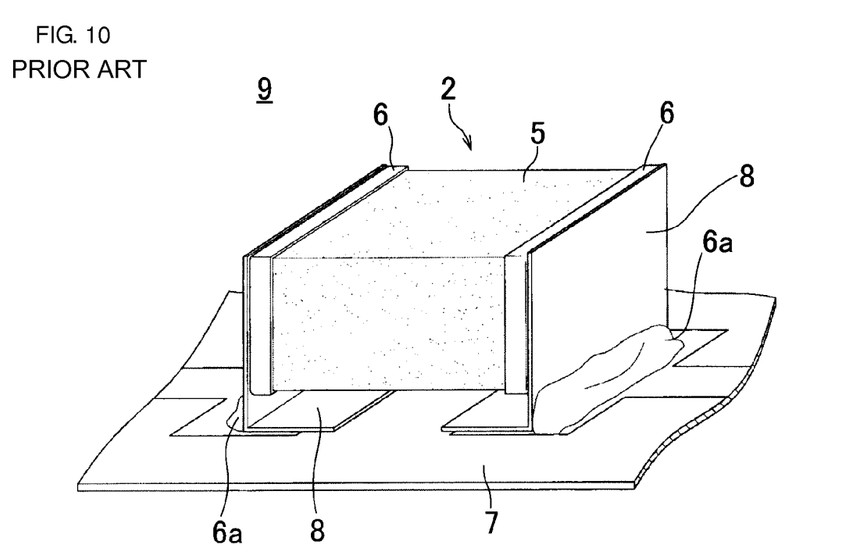
FIG. 10 is a perspective view illustrating an external appearance of a ceramic electronic component including a multilayer ceramic capacitor of related art, which is proposed to solve the problem with the multilayer ceramic capacitor illustrated in FIG. 9.

One example of solutions to cope with the above-described problem is, as illustrated in FIG. 10, to connect a pair of metal terminals 8 to the outer electrodes 6 of the multilayer ceramic capacitor 2 by soldering, and to solder the metal terminals 8 to the mounting substrate 7 such that a space is kept between the mounting substrate 7 and the multilayer ceramic capacitor 2. With such a configuration, the mechanical distortions occurring in the ceramic layers 3 upon application of the AC voltage can be absorbed by elastic deformations of the metal terminals 8, and the resulting vibration can be suppressed from being transmitted to the mounting substrate 7 through the outer electrodes 6. Thus, generation of noises can be reduced (see FIG. 21 in Japanese Patent No. 3847265).

However, a ceramic electronic component 9 described in Japanese Patent No. 3847265 includes a problem that, because the multilayer ceramic capacitor 2 and the pair of metal terminals 8 are fixedly connected to each other by soldering, the solders may be melted due to heating in a reflow process when the multilayer ceramic capacitor 2 is mounted to the mounting substrate 7, and the multilayer ceramic capacitor 2 may be detached from the pair of metal terminals 8.

Meanwhile, a lead-free high-temperature solder has recently been used as a bond for bonding the multilayer ceramic capacitor 2 and the pair of metal terminals 8. Such a solder is endurable against high temperatures up to a certain level. However, the general reflow temperature is about 220° C. to 260° C. Accordingly, even when the lead-free high-temperature solder is used as the bond, there is a fear that the bond may be melted depending on setting temperature, and the multilayer ceramic capacitor 2 may be detached from the pair of metal terminals 8.

SUMMARY OF THE INVENTION

Preferred embodiments of the present invention provide a ceramic electronic component including metal terminals attached to an electronic component body, in which the electronic component body is prevented from being detached from the metal terminals when the ceramic electronic component is mounted to a mounting substrate by carrying out a reflow process.

According to a preferred embodiment of the present invention, a ceramic electronic component includes an electronic component body including a bare ceramic body that includes two principal surfaces opposed to each other, two end surfaces opposed to each other, and two lateral surfaces opposed to each other, and outer electrodes arranged to cover the end surfaces of the bare ceramic body, and first and second metal terminals connected to the outer electrodes by solders containing Sn as a main constituent, wherein at least a Ni-plated film is provided on a surface layer portion of each of the outer electrodes, at least a Ni-plated film is provided on a surface layer portion of each of the first and second metal terminals, and an alloy layer containing Ni—Sn is provided in at least a portion of a bonding interface between adjacent two of the outer electrodes and the first and second metal terminals in a central region of each of the end surfaces.

In the ceramic electronic component according to a preferred embodiment of the present invention, preferably, each of the outer electrodes includes an underlying layer and a plating layer provided on a surface of the underlying layer, each of the first and second metal terminals includes a terminal body and a plating layer provided on a surface of the terminal body, and a metal of a material used as the terminal body of each of the first and second metal terminals and a metal of the underlying layer of each outer electrode are not diffused into the alloy layer.

In the ceramic electronic component according to a preferred embodiment of the present invention, preferably, each of the outer electrodes includes an underlying layer and two or more plating layers provided on a surface of the underlying layer, each of the first and second metal terminals includes a terminal body and two or more plating layers provided on a surface of the terminal body, and a metal of an upper plating layer in the plating layers of each of the first and second metal terminals, a metal of an upper plating layer in the plating layers of each outer electrode, and a metal of the solder are not diffused into a metal of the terminal body of corresponding one of the first and second metal terminals.

With the ceramic electronic components according to the various preferred embodiments of the present invention, the alloy layer containing Ni—Sn and having a high melting point is provided in at least a portion of the bonding interface between adjacent two of the outer electrodes and the first and second metal terminals in the central region of each of the end surfaces, and a region where a layer made of only Sn, i.e., a metal having a low melting point, does not exist is provided in that portion. Thus, since the first and second metal terminals are each connected to the outer electrode by the alloy layer containing Ni—Sn and having the high melting point, the electronic component body is prevented from being detached from the first and second metal terminals even in a reflow process that is performed, for example, when the ceramic electronic component is mounted to a mounting substrate.

With the features that each of the outer electrodes includes an underlying layer and a plating layer provided on a surface of the underlying layer, each of the first and second metal terminals includes a terminal body and a plating layer provided on a surface of the terminal body, and a metal of a material used as the terminal body of each of the first and second metal terminals and a metal of the underlying layer of each outer electrode are not diffused into the alloy layer, it is possible to maintain the strength of a connected portion between each of the first and second metal terminals and the outer electrode, and the strength of the outer electrode.

With the features that each of the outer electrodes includes an underlying layer and two or more plating layers provided on a surface of the underlying layer, each of the first and second metal terminals includes a terminal body and two or more plating layers provided on a surface of the terminal body, and a metal of an upper plating layer in the plating layers of each of the first and second metal terminals, a metal of an upper plating layer in the plating layers of each outer electrode, and a metal of the solder are not diffused into a metal of the terminal body of corresponding one of the first and second metal terminals, it is possible to maintain the strength of the connected portion between each of the first and second metal terminals and the outer electrode, and the strength of the outer electrode as in the above case.

Thus, with the various preferred embodiments of the present invention, in the ceramic electronic component including the metal terminals attached to the electronic component body, the electronic component body is prevented from being detached from the metal terminals when the ceramic electronic component is mounted to the mounting substrate by carrying out a reflow process.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A and 8B illustrate states where the ceramic electronic component is evaluated; specifically.

DETAILED DESCRIPTION OF THE PREFERRED EMBODIMENTS

Figure 1:
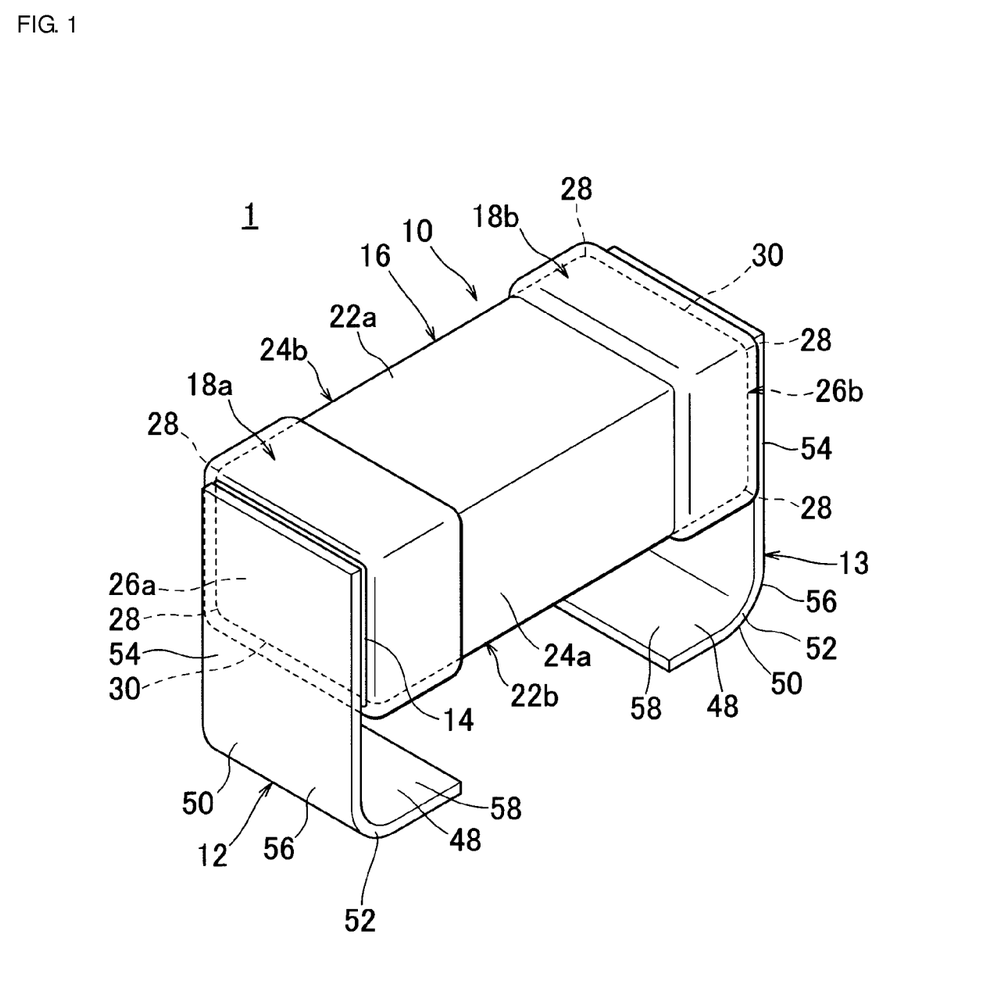
FIG. 1 is a perspective view illustrating an external appearance of one example of a ceramic electronic component according to a preferred embodiment of the present invention.
Figure 2:
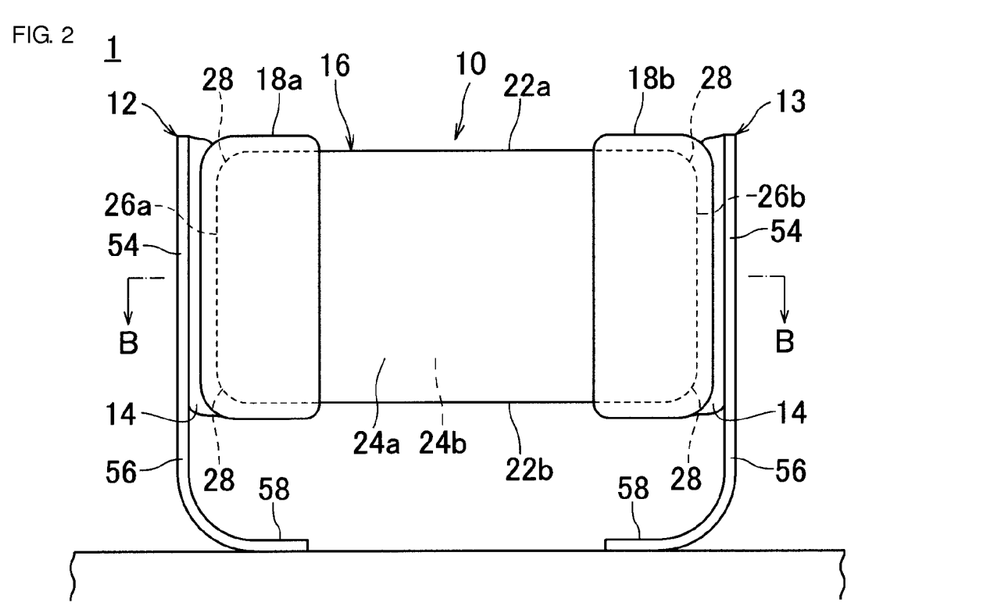
FIG. 2 is a side view illustrating the one example of the ceramic electronic component according to a preferred embodiment of the present invention.
Figure 3:
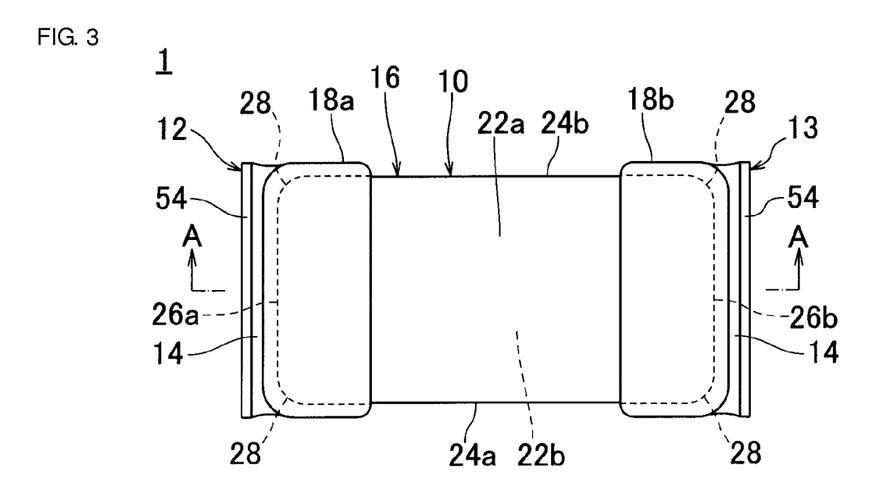
FIG. 3 is a plan view illustrating the one example of the ceramic electronic component according to a preferred embodiment of the present invention.
Figure 4:
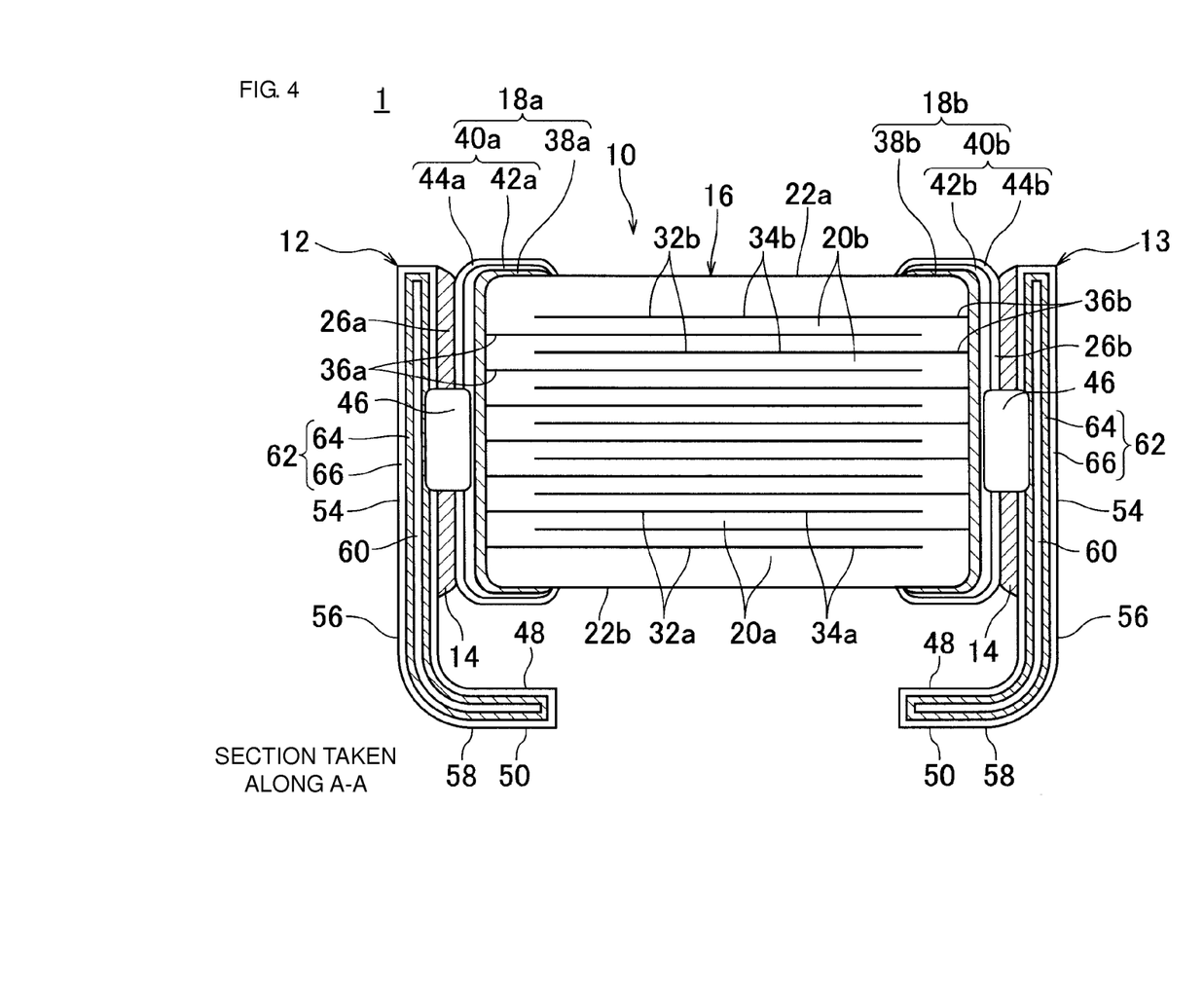
FIG. 4 is an explanatory sectional view illustrating a section of the ceramic electronic component taken along a line A-A in FIG. 3.
Figure 5:
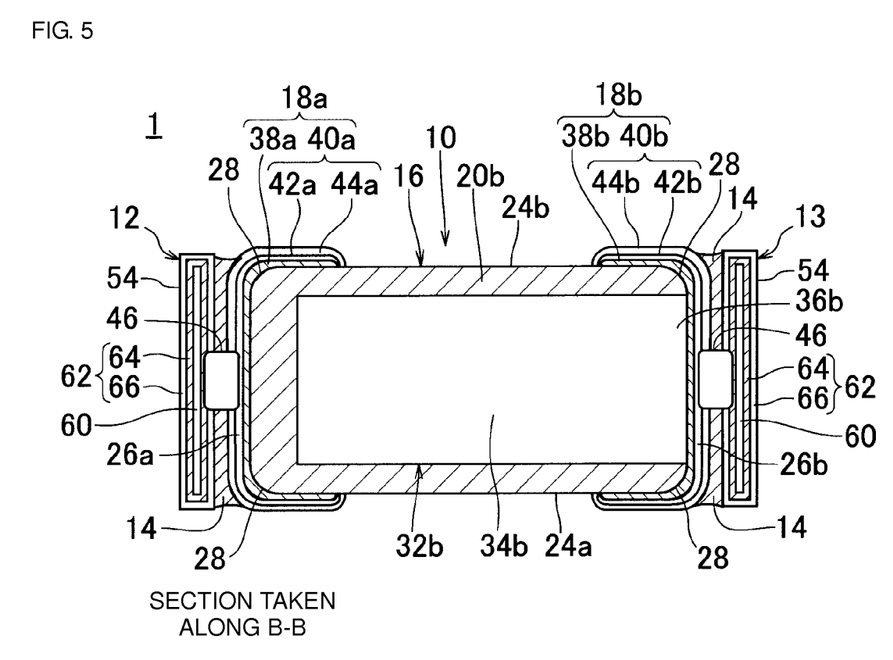
FIG. 5 is an explanatory sectional view illustrating a section of the ceramic electronic component taken along a line B-B in FIG. 2.

One example of a ceramic electronic component according to a preferred embodiment of the present invention will be described below. FIG. 1 is a perspective view illustrating an external appearance of the one example of the ceramic electronic component according to the present preferred embodiment of the present invention, FIG. 2 is a side view illustrating the one example of the ceramic electronic component, and FIG. 3 is a plan view illustrating the one example of the ceramic electronic component. FIG. 4 is an explanatory sectional view illustrating a section of the ceramic electronic component taken along a line A-A in FIG. 3, and FIG. 5 is an explanatory sectional view illustrating a section of the ceramic electronic component taken along a line B-B in FIG. 2. This preferred embodiment is described in connection with the case where an electronic component body is, for example, a multilayer ceramic capacitor.

The ceramic electronic component 1 according to this preferred embodiment includes an electronic component body 10 and first and second metal terminals 12 and 13. The electronic component body 10 and the first and second metal terminals 12 and are connected to each other through solders 14. The electronic component body 10 includes a bare ceramic body 16 (multilayer body) and first and second outer electrodes 18a and 18b that are provided on surfaces of the bare ceramic body 16.

The bare ceramic body 16 preferably includes a plurality of ceramic layers 20a and 20b stacked successively. The bare ceramic body 16 preferably has a rectangular or substantially rectangular parallelepiped shape. The bare ceramic body 16 includes a first principal surface 22a and a second principal surface 22b that extend in the lengthwise direction and in the widthwise direction, a first lateral surface 24a and a second lateral surface 24b that extend in the lengthwise direction and in the height direction, and a first end surface 26a and a second end surface 26b that extend in the widthwise direction and in the height direction. The first principal surface 22a and the second principal surface 22b represent surfaces parallel or substantially parallel to a surface to which the ceramic electronic component 1 is mounted. Corners 28 and ridges 30 of the bare ceramic body 16 are preferably rounded.

The ceramic layers 20a and 20b are made of, for example, a dielectric ceramic containing, as a main constituent, $BaTiO_3$, $CaTiO_3$, $SrTiO_3$, $CaZrO_3$, or the like. The dielectric ceramic may contain, in addition to such a main constituent, a Mn compound, a Mg compound, a Si compound, a Co compound, a Ni compound, a rare-earth compound, etc., as accessory constituents. Alternatively, the ceramic layers 20a and 20b may be made of a piezoelectric ceramic such as a PZT-based ceramic, a semiconductor ceramic such as a spinel-based ceramic, or a magnetic ceramic. Thicknesses of the ceramic layers 20a and 20b are each preferably about 0.5 µm or more and about 10 µm or less, for example.

In this preferred embodiment, because the bare ceramic body 16 is defined by the dielectric ceramic, the ceramic electronic component 1 defines and functions as a capacitor.

The bare ceramic body 16 includes a plurality of first inner electrodes 32a and a plurality of second inner electrodes 32b, which are individually sandwiched between the plural ceramic layers 20a and the plural ceramic layers 20b. The first and second inner electrodes 32a and 32b are opposed to each other in a state sandwiching one of the ceramic layers 20a and 20b. Electrical characteristics (such as an electrostatic capacity) are generated in a region where the first and second inner electrodes 32a and 32b are opposed to each other. The plural first inner electrodes 32a and the plural second inner electrodes 32b may be arranged in the states sandwiched between the ceramic layers 20a and 20b parallel or perpendicular to the mounting surface. The first and second inner electrodes 32a and 32b may be made of, for example, Ni, Cu, Ag, Pd, an Ag—Pd alloy, or Au. Thicknesses of the first and second inner electrodes 32a and 32b preferably are each about 0.3 µm or more and about 2.0 µm or less, for example. It is to be noted that, when the electronic component body 10 is not of the multilayer type, the first and second inner electrodes 32a and 32b are not provided.

Each of the first inner electrodes 32a includes an opposing portion 34a and an extending portion 36a. The opposing portion 34a is opposed to the second inner electrode 32b. The extending portion 36a is led out to extend from the opposing portion 34a to the first end surface 26a of the bare ceramic body 16. An end portion of the extending portion 36a of the first inner electrode 32a is exposed at the first end surface 26a of the bare ceramic body 16.

Similarly to the first principal surface 32a, each of the second inner electrodes 32b includes an opposing portion 34b opposed to the first inner electrode 32a, and an extending portion 36b led out to extend from the opposing portion 34b to the second end surface 26b of the bare ceramic body 16. An end portion of the extending portion 36b of the second inner electrode 32b is exposed at the second end surface 26b of the bare ceramic body 16.

On the first end surface 26a of the bare ceramic body 16, the first outer electrode 18a is configured to be electrically connected to the first inner electrode 32a while covering the first end surface 26a and the first inner electrode 32a. Similarly, on the second end surface 26b of the bare ceramic body 16, the second outer electrode 18b is configured to be electrically connected to the second inner electrode 32b while covering the second end surface 26b and the second inner electrode 32b.

The first outer electrode 18a includes an underlying layer 38a and a plating layer 40a provided on a surface of the underlying layer 38a. Similarly, the second outer electrode 18b includes an underlying layer 38b and a plating layer 40b provided on a surface of the underlying layer 38b.

The underlying layers 38a and 38b may be made of, for example, Cu, Ni, Ag, Pd, an Ag—Pd alloy, or Au. Among those materials, a base metal, e.g., Cu or Ni, is preferably used. The underlying layers 38a and 38b may be formed by co-firing in which the underlying layers 38a and 38b are fired at the same time as the first and second inner electrodes 32a and 32b, or by post-firing in which the underlying layers 38a and 38b are each formed by coating a conductive paste and baking the conductive paste. Alternatively, the underlying layers 38a and 38b may be formed directly by plating, or formed by hardening a conductive resin that contains a thermosetting resin. Thicknesses of the underlying layers 38a and 38b are each preferably about 10 µm or more and about 50 µm or less in a thickest portion thereof, for example.

On the other hand, the plating layers 40a and 40b are each made up of two or more plating films. For example, the plating layers 40a and 40b include lower plating films 42a and 42b and upper plating films 44a and 44b, respectively.

The lower plating films 42a and 42b are provided on the underlying layers 38a and 38b, respectively, and the upper plating films 44a and 44b are provided on the lower plating films 42a and 42b, respectively. The lower plating films 42a and 42b are each preferably made of a Ni-plated film. The Ni-plated film prevents solder leaching and functions as a barrier layer. The upper plating films 44a and 44b are each made of a Sn-plated film. The Sn-plated film improves wettability with respect to a solder and enhances bondability to the first and second metal terminals 12 and 13. Thicknesses of the lower plating films 42a and 42b and the upper plating films 44a and 44b are each preferably about 1 µm or more and about 10 µm or less, for example. It is to be noted that the upper plating films 44a and 44b are not always required to be formed.

The first and second metal terminals 12 and 13 are disposed to mount the ceramic electronic component 1 to the mounting substrate. For example, a plate-shaped lead frame is preferably used as each of the first and second metal terminals 12 and 13. The first metal terminal 12 constituted by the plate-shaped lead frame has a first principal surface 48 connected to the first outer electrode 18a, a second principal surface 50 on the side opposite to the first principal surface 48, and a peripheral surface 52 that defines a thickness between the first principal surface 48 and the second principal surface 50. The second metal terminal 13 constituted by the plate-shaped lead frame also includes a first principal surface 48 connected to the second outer electrode 18b, a second principal surface 50 on the side opposite to the first principal surface 48, and a peripheral surface 52 that defines a thickness between the first principal surface 48 and the second principal surface 50. Moreover, the first and second metal terminals 12 and 13 constituted by the plate-shaped lead frames are each provided in an L-shaped section. Because the first and second metal terminals 12 and 13 are each provided in an L-shaped section, durability against flexure of the mounting substrate is improved when the ceramic electronic component 1 is mounted the mounting substrate.

Each of the first and second metal terminals 12 and 13 includes, for example, a terminal bonding portion 54 in the form of a rectangular or substantially rectangular plate, an extending portion 56 that extends from the terminal bonding portion 54 toward the mounting surface, and a mounting portion 58 that extends from the extending portion 56 in a direction interconnecting the first end surface 26a and the second end surface 26b.

The terminal bonding portion 54 of the first metal terminal 12 serves as a portion that is positioned close to the first end surface 26a of the electronic component body 10 and that is connected to the first outer electrode 18a. The terminal bonding portion 54 of the second metal terminal 13 serves as a portion that is positioned close to the second end surface 26b of the electronic component body 10 and that is connected to the second outer electrode 18b. More specifically, the terminal bonding portion 54 of the first metal terminal 12 is, for example, in the form of a rectangular or substantially rectangular plate having a width substantially equal to that of the first outer electrode 18a of the electronic component body 10, and the first metal terminal 12 is connected at the first principal surface 48 thereof to the first outer electrode 18a by the solder 14. The terminal bonding portion 54 of the second metal terminal 13 is, for example, in the form of a rectangular or substantially rectangular plate having a width equal or substantially equal to that of the second outer electrode 18b of the electronic component body 10, and the second metal terminal 13 is connected at the first principal surface 48 thereof to the second outer electrode 18b by the solder 14.

The extending portion 56 of each of the first and second metal terminals 12 and 13 is a portion extending from the terminal bonding portion 54 up to a position contacting the mounting substrate, and it serves to float the electronic component body 10 from the mounting substrate to which the electronic component body 10 is mounted. More specifically, the respective extending portion 56 of the first and second metal terminals 12 and 13 are each, for example, in the form of a rectangular or substantially rectangular plate, and are each configured to extend from the terminal bonding portion 54 toward the mounting substrate in the height direction perpendicular or substantially perpendicular to the second principal surface 22b of the bare ceramic body 16 such that the extending portion 56 and the terminal bonding portion 54 are arranged in a coplanar relationship.

The mounting portion 58 of the first metal terminal 12 is bent to extend from an end of the extending portion 56 of the first metal terminal 12 in the lengthwise direction parallel or substantially parallel to the second principal surface 22b such that the mounting portion 58 is contactable with the mounting substrate. The mounting portion 58 of the first metal terminal 12 is bent in the direction to extend toward the center of the electronic component body 10. The mounting portion 58 of the second metal terminal 13 is bent to extend from an end of the extending portion 56 of the second metal terminal 13 in the lengthwise direction parallel or substantially parallel to the second principal surface 22b such that the mounting portion 58 is contactable with the mounting substrate. The mounting portion 58 of the second metal terminal 13 is also bent in the direction to extend toward the center of the electronic component body 10.

Lengths of the respective mounting portions 58 of the first and second metal terminals 12 and 13 may be set larger than those of the first and second outer electrodes 18a and 18b in the lengthwise direction, which are provided on the second principal surface 22b of the bare ceramic body 16 (on the side closer to the mounting surface). By so setting, when, in a step of mounting the ceramic electronic component 1, a component position is detected while an image of the ceramic electronic component 1 is recognized from below by a camera, the first and second outer electrodes 18a and 18b of the electronic component body 10 are prevented from being erroneously recognized as the first and second metal terminals 12 and 13. Thus, a detection error is avoided.

The lengths of the mounting portions 58 of the first and second metal terminals 12 and 13 may be set larger than those of the extending portions 56 of the first and second metal terminals 12 and 13. Furthermore, respective corners of the first and second metal terminals 12 and 13 where the extending portions 56 and the mounting portions 58 of the first and second metal terminals 12 and 13 intersect may be rounded.

Each of the first and second metal terminals 12 and 13 includes a terminal body 60 and a plating film 62 arranged over a surface of the terminal body 60.

The terminal body 60 is preferably made of Ni, Fe, Cu, Ag, Cr, or an alloy containing one or more of those metals as main constituents. Preferably, the terminal body 60 preferably is made of Ni, Fe, Cr, or an alloy containing one or more of those metals as main constituents. More specifically, a metal constituting a parent material of the terminal body 60 is preferably, for example, a Fe-42Ni alloy or a Fe-18Cr alloy. A thickness of the terminal body 60 is preferably about 0.05 mm or more and about 0.5 mm or less. Heat resistance of the first and second outer electrodes 18a and 18b preferably is increased by using, to form the terminal body 60, Ni, Fe, Cr, each having a high melting point, or an alloy containing one or more of those metals as main constituents.

On the other hand, the plating film 62 includes two or more plating films, e.g., a lower plating film 64 and an upper plating film 66.

The lower plating film 64 is provided on the terminal body 60, and the upper plating film 66 is provided on the lower plating film 64. The lower plating film 64 is made of a Ni-plated film. A thickness of the lower plating film 64 is preferably about 0.2 μm or more and about 5.0 μm or less, for example.

The upper plating film 66 is made of a Sn-plated film. Solderability of the first and second metal terminals 12 and 13 with respect to the first and second outer electrodes 18a and 18b are improved preferably by using Sn or an alloy containing Sn as a main constituent to form the upper plating film 66. A thickness of the upper plating film 66 is preferably about 1.0 μm or more and about 5.0 μm or less, for example. It is to be noted that the upper plating film 66 is not always required to be formed.

The solder 14 is used to bond the first outer electrode 18a and the terminal bonding portion 54 of the first metal terminal 12. The solder 14 is also used to bond the second outer electrode 18b and the terminal bonding portion 54 of the second metal terminal 13. The solder 14 may be a solder containing Sn as a main constituent. For example, an LF (lead-free) solder of Sn—Sb, Sn—Ag—Cu, Sn—Cu, or Sn—Bi can be used. In the case of the Sn—Sb solder, particularly, the content of Sb is preferably about 5% or more and about 15% or less, for example.

As described above, the first and second outer electrodes 18a and 18b are connected respectively to the first and second metal terminals 12 and 13 by the solders 14. Furthermore, in portions of respective bonding interfaces between the first and second outer electrodes 18a and 18b and the first and second metal terminals 12 and 13 in central regions of the first and second outer electrodes 18a and 18b on the sides corresponding to the end surfaces, alloy layers 46 containing Ni—Sn are positioned which are defined respectively by the lower plating films 42a and 42b and the upper plating films 44a and 44b of the first and second outer electrodes 18a and 18b, the solders 14, and the lower plating films 64 and the upper plating films 66 of the first and second metal terminals 12 and 13.

More specifically, as illustrated in FIGS. 4 and 5, only in central regions of bonded portions including the first and second outer electrodes 18a and 18b, the first and second metal terminals 12 and 13, and the solders 14, the alloy layers 46 containing Ni—Sn are positioned which are defined respectively by the lower plating films 42a and 42b and the upper plating films 44a and 44b of the first and second outer electrodes 18a and 18b, the solders 14, and the lower plating films 64 and the upper plating films 66 of the first and second metal terminals 12 and 13. The solders 14 are further positioned around the alloy layers 46. The alloy layers 46 are provided in portions that are heated under pressing by a soldering iron or a heater jig when the first and second metal terminals 12 and 13 are bonded to the first and second outer electrodes 18a and 18b, respectively.

The term "bonding interfaces" implies bonding surfaces where the first and second outer electrodes 18a and 18b and the first and second metal terminals 12 and 13 are bonded respectively to each other by the solders 14. The alloy layers imply layers where Ni and Sn can be both detected at the bonding interfaces between the first and second outer electrodes 18a and 18b and the first and second metal terminals 12 and 13 by an energy dispersive X-ray analysis (EDX analysis).

A rate of Ni in the alloy layer 46 containing Ni—Sn is preferably about 13% or more, for example. With that setting, in the ceramic electronic component 1 in which the first and second metal terminals 12 and 13 are attached to the electronic component body 10, it is possible to obtain the ceramic electronic component 1 capable of more effectively preventing the electronic component body 10 from being detached from the first and second metal terminals 12 and 13 when the ceramic electronic component 1 is mounted to the mounting substrate by carrying out a reflow process.

The rate of Ni in the alloy layer 46 preferably is measured by a method described below.

First, the ceramic electronic component 1 is polished along its lateral surface up to the center of the ceramic electronic component 1 (i.e., through a distance corresponding to about ½ of a length of the ceramic electronic component 1 in the widthwise direction), thus exposing a section at the center of the ceramic electronic component 1. Then, a quantitative analysis is performed at the exposed section for each of elements Cr, Fe, Ni, Cu and Sn in central regions of the respective bonding interfaces between the first and second outer electrodes 18a and 18b and the first and second metal terminals 12 and 13 by utilizing the function of an energy dispersive X-ray analyzer (EDX analyzer) equipped in a scanning electron microscope (SEM). The rate of Ni is then calculated from Ni/(Ni+Sn).

Figure 6:
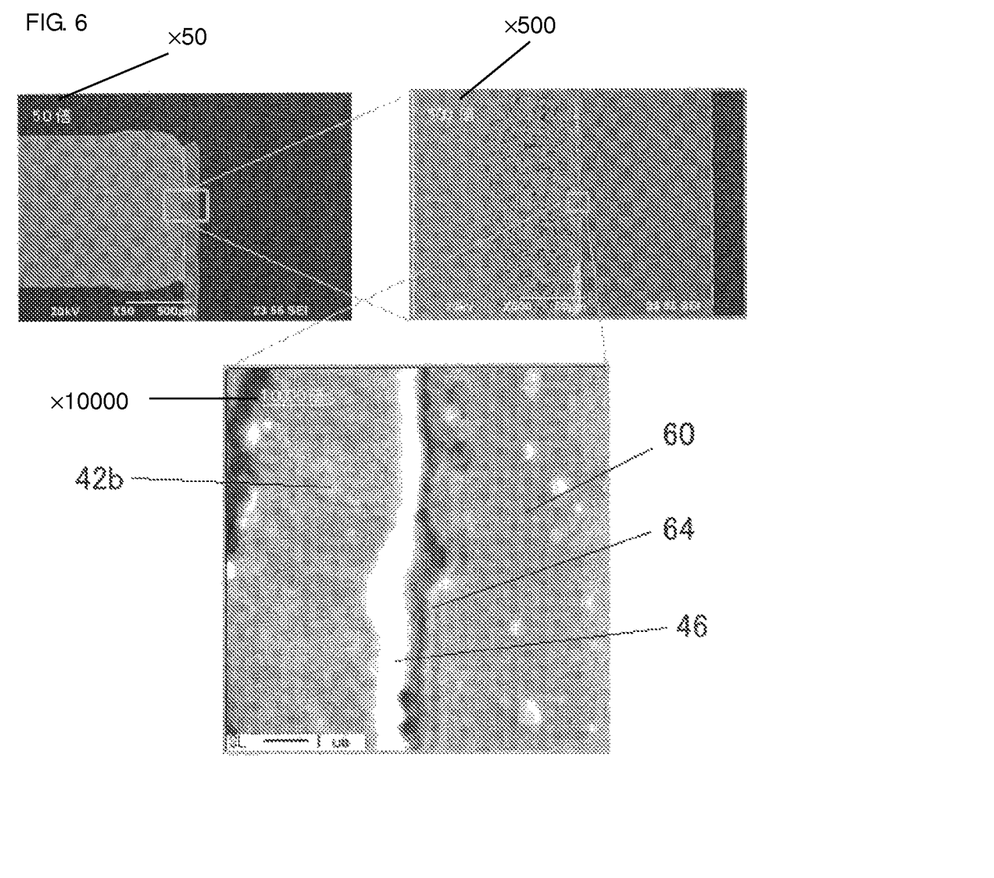
FIG. 6 depicts SEM images each representing a section of the ceramic electronic component according to a preferred embodiment of the present invention.

FIG. 6 depicts SEM images each representing a section of the ceramic electronic component according to the present preferred embodiment of the present invention. As seen from FIG. 6, at the bonding interfaces between the first and second outer electrodes 18a and 18b and the first and second metal terminals 12 and 13, the alloy layers 46 containing Ni—Sn are positioned which are defined respectively by the lower plating films 42a and 42b and the upper plating films 44a and 44b of the first and second outer electrodes 18a and 18b, the solders 14, and the lower plating films 64 and the upper plating films 66 of the first and second metal terminals 12 and 13.

A thickness of the alloy layer 46 is preferably about 0.2 μm or more and about 4.0 μm or less, for example. With that setting, a chip is satisfactorily prevented from being detached in the reflow process. If the alloy layer 46 has a thickness of greater than about 4.0 μm, a total amount of heat applied during heating would be increased and heat would be conducted up to the mounting portions 58 of the first and second metal terminals 12 and 13, thus causing a state where the first and second metal terminals 12 and 13 are left to stand in the atmosphere at high temperature. Accordingly, the plating films 62 on the surfaces of the first and second metal terminals 12 and 13 would deteriorate, and a difficulty would arise in obtaining satisfactory solderability in some cases when the ceramic electronic component 1 is mounted to the mounting substrate.

Preferably, a metal of the material used as each of the terminal bodies 60 of the first and second metal terminals 12 and 13 and a metal of the material used as each of the underlying layers 38a and 38b of the first and second outer electrodes 18a and 18b are not diffused into the alloy layer 46. In other words, a very large total amount of heat is needed to diffuse the metal of the terminal bodies 60 and the metal of the underlying layers 38a and 38b of the first and second outer electrodes 18a and 18b into the alloy layers 46. Thus, excessive diffusion of those metals implies a risk that minute voids or cracks may occur in the first and second outer electrodes 18a and 18b. In particular, when the main constituent of the underlying layers 38a and 38b of the first and second outer electrodes 18a and 18b is Cu and the main constituent of the solder 14 is Sn, Cu excessively diffuses (melts) into Sn, thus increasing the possibility of a risk that the so-called copper leaching may occur. In the present preferred embodiment of the present invention, strength of the bonded regions and strength of the first and second outer electrodes 18a and 18b are both obtained at satisfactory levels by causing the metal of the terminal bodies 60 of the first and second metal terminals 12 and 13 and the metal of the underlying layers 38a and 38b of the first and second outer electrodes 18a and 18b to be not diffused into the alloy layer 46. Similarly, it is preferable that the metal of the upper plating film 66 of each of the first and second metal terminals 12 and 13, the metal of each of the upper plating films 44a and 44b of the first and second outer electrodes 18a and 18b, and the metal of the solder 14 are not diffused into the metal of the terminal body 60 of corresponding one of the first and second metal terminals 12 and 13.

One example of a manufacturing method for the ceramic electronic component having the above-described configuration will be described below in connection with the ceramic electronic component 1 as an example.

First, a ceramic green sheet, a conductive paste for the inner electrodes, which is used to form the first and second inner electrodes 32a and 32b, and a conductive paste for the outer electrodes, which is used to form the first and second outer electrodes 18a and 18b, are prepared. While an organic binder and an organic solvent are contained in the ceramic green sheet, the conductive paste for the inner electrodes, and the conductive paste for the outer electrodes, the organic binder and the organic solvent may be ordinary ones.

The conductive paste for the inner electrodes is then printed, for example, in a predetermined pattern on the ceramic green sheet, such that a pattern of the inner electrode is formed on the ceramic green sheet. The conductive paste for the inner electrodes can be printed by an ordinary method, such as screen printing, for example.

Next, a predetermined number of ceramic green sheets for an outer layer are stacked, each of those ceramic green sheets not including the inner electrode pattern printed thereon. The ceramic green sheets on each of which the inner electrode pattern is printed are stacked successively on the ceramic green sheets for the outer layer. Furthermore, a predetermined number of ceramic green sheets for another outer layer are stacked thereon. A mother multilayer body is thus fabricated. The mother multilayer body may be press-bonded in the stacking direction by a hydrostatic press, for example.

Thereafter, the mother multilayer body is cut into pieces each having a predetermined shape and size, such that a green ceramic multilayer body is cut out. At that time, corners and ridges of the green ceramic multilayer body may be rounded by barrel polishing, for example. Then, the cut-out ceramic multilayer body is fired and the bare ceramic body 16 is obtained in the form of a multilayer body. A firing temperature of the green multilayer body is preferably about 900° C. or more and 1300° C. or less though depending on the ceramic material and the material of the conductive paste for the inner electrodes.

Next, the underlying layers 38a and 38b of the first and second outer electrodes 18a and 18b are formed by coating the conductive paste for the outer electrodes over both the end surfaces of the fired bare ceramic body 16 with the dipping technique, for example, and by baking the coated conductive paste. A baking temperature is preferably about 700° C. or more and 900° C. or less. The plating layers 40a and 40b are then formed on respective surfaces of the underlying layers 38a and 38b. The plating layers 40a and 40b are each formed in two layers. More specifically, the lower plating films 42a and 42b are formed on respective surfaces of the underlying layers 38a and 38b, and the upper plating films 44a and 44b are formed on respective surfaces of the lower plating films 42a and 42b. The electronic component body 10 is thus obtained.

The firing of the conductive paste for the outer electrodes and the firing of the green multilayer body are performed in, e.g., the ambient atmosphere (air), an atmosphere of $N_2$, or in an atmosphere of water vapor+$N_2$. The term "dipping technique" implies a coating method of dipping the bare ceramic body in the conductive paste for the outer electrodes, thus forming the outer electrodes on the bare ceramic body.

An example of a process of attaching the metal terminals in the manufacturing method for the ceramic electronic component according to the present preferred embodiment of the present invention will be described below.

First, the desired first and second metal terminals 12 and 13 are prepared. The first and second metal terminals 12 and are constituted by forming a Ni-plated film as the lower plating film 64 and a Sn-plated film as the upper plating film 66 on the surface of the terminal body 60 of each of the first and second metal terminals 12 and 13.

Next, the solders 14 are coated over the respective end surfaces of the first and second outer electrodes 18a and 18b of the electronic component body 10.

Thereafter, the respective first principal surfaces 48 of the first and second metal terminals 12 and 13 are abutted against the first and second outer electrodes 18a and 18b over which the solders 14 are coated, and the first and second metal terminals 12 and 13 are tentatively fixed to the first and second outer electrodes 18a and 18b by the solders 14 while a soldering iron (or a heater jig) is pressed against the bonded regions for heating. A heating temperature is preferably about 250° C. to 500° C.

As a result, in portions of the respective bonding interfaces between the first and second outer electrodes 18a and 18b and the first and second metal terminals 12 and 13, the alloy layers 46 containing Ni—Sn are formed which include respectively the lower plating films 42a and 42b and the upper plating films 44a and 44b of the first and second outer electrodes 18a and 18b, the solders 14, and the lower plating films 64 and the upper plating films 66 of the first and second metal terminals 12 and 13. The alloy layers 46 are formed in regions that are heated under pressing by the soldering iron or the heater jig when the first and second metal terminals 12 and 13 are bonded to the first and second outer electrodes 18a and 18b, respectively.

Then, the electronic component body 10 having been tentatively fixed as described above is subjected to the reflow process, such that the first and second outer electrodes 18a and 18b and the first and second metal terminals 12 and 13 are connected, respectively. The electronic component body 10 is thus completely fixed.

Through the above-described steps, the ceramic electronic component 1 illustrated in FIG. 1 is obtained.

When the first and second metal terminals 12 and 13 are bonded respectively to the first and second outer electrodes 18a and 18b in the tentatively fixing step as described above, the alloy layers 46 with the high melting points are partly formed in the bonding interfaces between the first and second metal terminals 12 and 13 and the first and second outer electrodes 18a and 18b because the bonded regions are heated under pressing by, e.g., the soldering iron (i.e., with thermo-compression bonding). Sufficient heat is further applied to the bonded regions in the reflow process in the completely fixing step that is carried out after the tentatively fixing step with the thermo-compression bonding. In the bonded regions, therefore, the alloy layers 46 containing Ni—Sn are generated and a layer made of only Sn is not present. Stated in another way, by bonding respectively the first and second metal terminals 12 and 13 and the first and second outer electrodes 18a and 18b with the thermo-compression bonding for tentative fixing and then completely fixing them in the reflow process, Sn contained as the main constituent in the solders 14 is caused to react with Ni and to produce the alloy layers 46. As a result, a region where a layer made of only Sn does not exit is formed. Moreover, in a portion where the alloy layer 46 is formed, the solder 14 is substantially not present and only the alloy layer 46 is present.

With the ceramic electronic component 1 according to the present preferred embodiment, since the alloy layers 46 containing Ni—Sn and defined respectively by the lower plating films 42a and 42b and the upper plating films 44a and 44b of the first and second outer electrodes 18a and 18b, the solders 14, and the lower plating films 64 and the upper plating films 66 of the first and second metal terminals 12 and 13 are positioned in the bonding interfaces between the first and second outer electrodes 18a and 18b and the first and second metal terminals 12 and 13 in the central regions of the first and second outer electrodes 18a and 18b on the sides corresponding to the end surfaces, sufficient strength in the bonding between the first and second metal terminals 12 and 13 and the first and second outer electrodes 18a and 18b can be held. Since the alloy layer 46 containing Ni—Sn and having the high melting point is formed, the region where a layer made of only Sn having the low melting point does not exit is formed. Moreover, in the portion where the alloy layer 46 is formed, the solder 14 is substantially not present and only the alloy layer 46 is present. Thus, since the portions bonded by the alloy layers 46 with the high melting point are present though being locally (i.e., in the central regions on the sides corresponding to the end surfaces), the electronic component body 10 is prevented from being detached from the first and second metal terminals 12 and 13 even in the reflow process for mounting to the substrate.

One example of a ceramic electronic component according to another preferred embodiment of the present invention will be described below.

Figure 7:
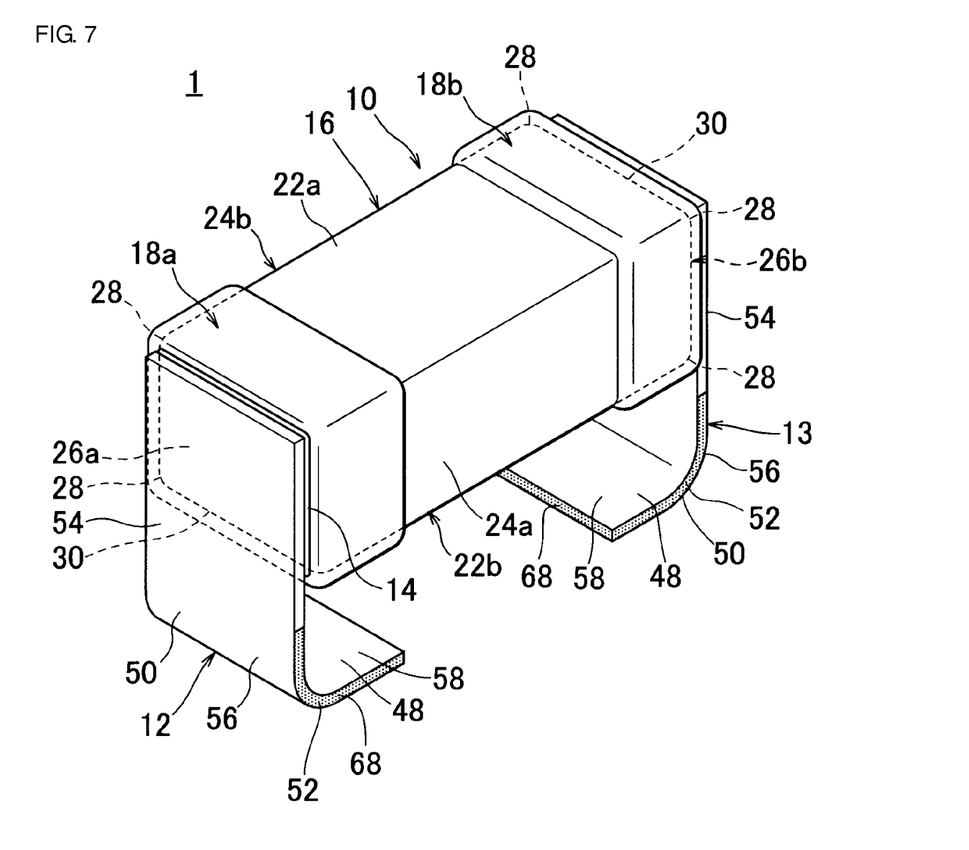
FIG. 7 is a perspective view illustrating an external appearance of one example of a ceramic electronic component according to another preferred embodiment of the present invention.

FIG. 7 is a perspective view illustrating an external appearance of the one example of the ceramic electronic component according to another preferred embodiment of the present invention. The same elements in FIG. 7 as those in the ceramic electronic component 1 illustrated in FIG. 1 are denoted by the same reference symbols, and description of those elements is omitted.

In the ceramic electronic component 1 according to the present preferred embodiment, illustrated in FIG. 7, non-plated portions 68 in which no plated films are present are formed in the peripheral surfaces 52 of the extending portions 56 and the mounting portions 58 of the first and second metal terminals 12 and 13. In the non-plated portions 68, the surfaces of the terminal bodies 60 are exposed.

By forming the non-plated portions 68, in which no plated films are present, in the peripheral surfaces 52 of the extending portions 56 and the mounting portions 58 of the first and second metal terminals 12 and 13, the surfaces of the terminal bodies 60 are exposed in the non-plated portions 68 as mentioned above. Therefore, when the ceramic electronic component 1 is mounted to the mounting substrate by solders applied for the mounting, the mounting solders are prevented from rising along the first and second metal terminals 12 and 13 due to wetting properties with respect to them. Hence, the mounting-solders are prevented from rising due to the wetting properties up to a region (floating space) between the electronic component body 10 and the first and second metal terminals 12 and 13, and the mounting solders are prevented from being filled into the floating space. Thus, since the floating space can be ensured as a sufficient vacant space, it is possible to prevent transmission of vibration to the mounting substrate without impeding elastic deformation of the metal terminals, and to more stably prevent the occurrence of acoustic noises in the ceramic electronic component.

Moreover, when the non-plated portions 68 are further present in the peripheral surfaces 52 of the terminal bonding portions 54 of the first and second metal terminals 12 and 13, the mounting solders are more reliably prevented from rising along the first and second metal terminals 12 and 13 due to the wetting properties. Hence, the mounting solders are more effectively prevented from rising due to the wetting properties into the floating space between the electronic component body 10 and the first and second metal terminals 12 and 13.

EXPERIMENTAL EXAMPLES

By using the ceramic electronic component obtained with the above-described method, an experiment was conducted to confirm whether the electronic component body was not detached from the metal terminals, displaced, or tilted in the reflow process when the ceramic electronic component was mounted to the mounting substrate. In the experiment conducted here, with intent to grasp an allowance in reflow heat resistance, a deviation in the bonded portion between the electronic component body and the metal terminal was examined by carrying out the reflow process in a loaded state (i.e., a state where another component serving as a weight is placed on the electronic component body). More specifically, a load chip (5750-size chip in this experiment) serving as a load was bonded to the upper surface of the ceramic electronic component according to the present preferred embodiment of the present invention by using a thermosetting adhesive. In such a state, the ceramic electronic component was mounted to a mounting substrate by carrying out the reflow process. Behaviors of the electronic component body were observed before and after the reflow process.

Evaluation of Ceramic Electronic Component

To conduct evaluation experiments, the following ceramic electronic component was first fabricated as EXAMPLE in accordance with the above-described manufacturing method for the ceramic electronic component.

Ceramic Electronic Component Used in Experiment Size (design value) of the ceramic electronic component: L×W×T=2.0 mm×1.25 mm×1.25 mm Material of the terminal body of the metal terminal: SUS430 (ferrite-based stainless)

Films plated on the metal terminal: The lower plating film was made of a Ni-plated film and the upper plating film was made of a Sn-plated film. Thickness of the Ni-plated film was 1.5 μm and thickness of the Sn-plated film was 2.5 μm (design value).

Length of the extending portion of the metal terminal (floating distance of the electronic component body): 0.5 mm As a COMPARATIVE EXAMPLE, a ceramic electronic component was prepared in which the electronic component body and the metal terminals were bonded to each other by carrying out the reflow process alone without performing the thermo-compression bonding (i.e., the tentatively fixing step) by the soldering iron.

Five samples were evaluated for each of EXAMPLE and COMPARATIVE EXAMPLE.

In each of the five samples of COMPARATIVE EXAMPLE, the alloy layer was not formed because the thermo-compression bonding (i.e., the tentatively fixing step) by the soldering iron was not performed. In each of the five samples of EXAMPLE, the alloy layer including Ni—Si was formed in the central region of the bonding interface between the outer electrode and the metal terminal because the thermo-compression bonding (i.e., the tentatively fixing step) by the soldering iron was performed.

In the prepared five samples of EXAMPLE, the rate of Ni in the alloy layer was about 13% in a sample 1, about 20% in a sample 2, about 27% in a sample 3, about 35% in a sample 4, and about 38% in a sample 5. A diameter of the alloy layer containing Ni—Sn in each sample was about 300 μm.

The rate of Ni in the alloy layer was measured by a method described below.

Each sample of EXAMPLE was polished along its lateral surface up to a center of the sample (i.e., through a distance corresponding to about ½ of a length of the sample in the widthwise direction), thus making a section exposed at the center of the sample. Then, a quantitative analysis was performed at the exposed section for each of elements Cr, Fe, Ni, Cu and Sn in a central region of the bonding interface between the outer electrode and the metal terminal by utilizing an energy dispersive X-ray analyzer (EDX analyzer) equipped in a scanning electron microscope (SEM). The rate of Ni was then calculated from Ni/(Ni+Sn).

Evaluation Method

Figure 8A:
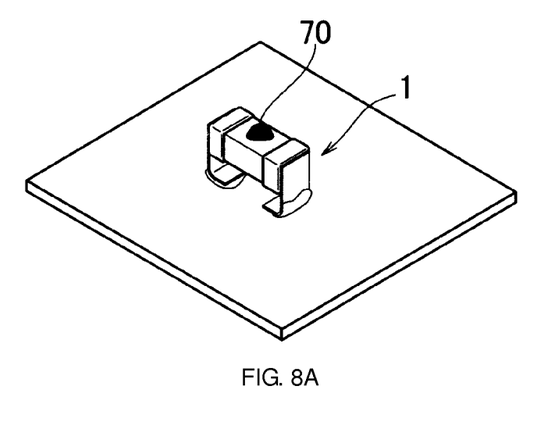
FIG. 8A illustrates a state where a thermosetting adhesive is applied to the ceramic electronic component.
Figure 8B:
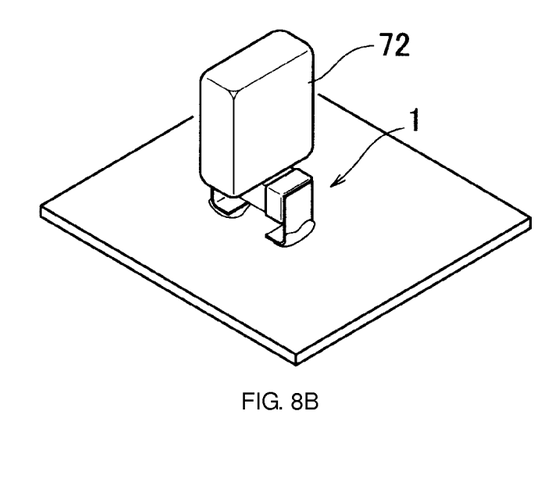
FIG. 8B illustrates a state where a load chip is attached to the ceramic electronic component.

FIGS. 8A and 8B illustrates states where the ceramic electronic component is evaluated; specifically, FIG. 8A illustrates a state where a thermosetting adhesive is applied to the ceramic electronic component, and FIG. 8B illustrates a state where a load chip is attached to the ceramic electronic component. Evaluation conditions were set as follows.

Manner of fixing the load chip: A load chip 72 was fixed using a thermosetting adhesive 70. The thermosetting adhesive 70 was applied to a position near a center of the first principal surface of the bare ceramic body of the ceramic electronic component 1 (see FIG. 8A).

Load chip: 5750 chip (L×W×T=5.7 mm×5.0 mm×1.8 mm), 265 mg (23 times the weight of the ceramic electronic component used in the experiment).

Attached state of the load chip: The load chip 72 was attached, using the thermosetting adhesive 70, to the position near the center of the first principal surface of the bare ceramic body of the ceramic electronic component 1 (see FIG. 8B).

Condition of the reflow process: Maximum temperature at 270° C./ambient atmosphere (air)

As a result of the evaluation experiments, for the ceramic electronic components of EXAMPLE according to various preferred embodiments of the present invention, the electronic component body was not detached from the metal terminals in any of the five samples subjected to the experiments. On the other hand, for the ceramic electronic components of COMPARATIVE EXAMPLE, tilting of the electronic component body (i.e., detachment of the electronic component body) occurred in one of the five samples subjected to the experiments because deviation was generated in the bonding interface between the outer electrode and the metal terminal. From the results of the evaluation experiments, the following fact was confirmed. When the metal terminals are bonded to the electronic component body by using the solders, the alloy layer with the high melting point is partly formed in the bonding interface between the outer electrode and the metal terminal by bonding them through the thermo-compression bonding. With the formation of the alloy layer, an allowance in reflow heat resistance is increased.

In the ceramic electronic component 1 according to the above-described preferred embodiments, the bare ceramic body constituting the electronic component body functions as a capacitor because the bare ceramic body is defined by the dielectric ceramic. However, the preferred embodiments of the present invention are not limited to that case. The ceramic electronic component functions as a piezoelectric component when a piezoelectric ceramic is used, as a thermistor when a semiconductor ceramic is used, and as an inductor when a magnetic ceramic is used, for example. In the case of the ceramic electronic component functioning as an inductor, the inner electrode is defined by a coil-shaped conductor, for example.

It is to be noted that the present invention is not limited to the above-described preferred embodiments, and that the present invention can be practiced in variously modified forms within the scope not departing from the gist of the present invention. Thus, the thickness, the number, the opposing electrode area, and the external dimensions of the ceramic layers in the multilayer ceramic capacitor are not limited to the above-mentioned ones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   an electronic component body including a bare ceramic body including two principal surfaces opposed to each other, two end surfaces opposed to each other, and two lateral surfaces opposed to each other, and outer electrodes arranged to cover the end surfaces of the bare ceramic body; and
   first and second metal terminals connected to the outer electrodes by solder containing Sn as a main constituent; wherein
   at least a Ni-plated film is provided on a surface layer portion of each of the outer electrodes;
   at least a Ni-plated film is provided on a surface layer portion of each of the first and second metal terminals; and
   an alloy layer containing Ni—Sn is provided in at least a portion of a bonding interface between an adjacent pair of the outer electrodes and the first and second metal terminals in a central region of each of the end surfaces.

2. The ceramic electronic component according to claim 1, wherein
   each of the outer electrodes includes an underlying layer and a plating layer provided on a surface of the underlying layer;
   each of the first and second metal terminals includes a terminal body and a plating layer provided on a surface of the terminal body; and
   a metal of a material used as the terminal body of each of the first and second metal terminals and a metal of the underlying layer of each outer electrode are not diffused into the alloy layer.

3. The ceramic electronic component according to claim 1, wherein
   each of the outer electrodes includes an underlying layer and at least two plating layers provided on a surface of the underlying layer;
   each of the first and second metal terminals includes a terminal body and at least two plating layers provided on a surface of the terminal body; and
   a metal of an upper plating layer in the plating layers of each of the first and second metal terminals, a metal of an upper plating layer in the plating layers of each outer electrode, and a metal of the solder are not diffused into a metal of the terminal body of a corresponding one of the first and second metal terminals.

4. The ceramic electronic component according to claim 1, wherein the bare ceramic body is a multilayer body.

5. The ceramic electronic component according to claim 1, wherein the bare ceramic body includes a plurality of ceramic layers and a plurality of inner electrodes each disposed between adjacent pairs of the plurality of ceramic layers.

6. The ceramic electronic component according to claim 1, wherein the first and second metal terminals are each defined by a plate-shaped lead frame.

7. The ceramic electronic component according to claim 1, wherein the first and second metal terminals are each provided in an L-shaped section.

8. The ceramic electronic component according to claim 1, wherein each of the first and second metal terminals includes a terminal bonding portion, an extending portion configured to extend from the terminal bonding portion, and a mounting portion configured to extend from the extending portion.

9. The ceramic electronic component according to claim 8, wherein the extending portion is configured to float the electronic component body from a mounting substrate on which the electronic component body is mounted.

10. The ceramic electronic component according to claim 8, wherein the extending portion is a plate extending from the terminal bonding portion in a height direction of the electronic component body.

11. The ceramic electronic component according to claim 8, wherein the extending portion and the terminal bonding portion are arranged in a coplanar relationship.

12. The ceramic electronic component according to claim 8, wherein the mounting portion is bent to extend toward a center of the electronic component body.

13. The ceramic electronic component according to claim 8, wherein the mounting portion is bent to extend from an end of the extending portion in a direction parallel or substantially parallel to one of the two principal surfaces.

14. The ceramic electronic component according to claim 8, wherein a length of the mounting portion is greater than that of the outer electrodes.

15. The ceramic electronic component according to claim 8, wherein a length of the mounting portion is greater than that of the extending portion.

16. The ceramic electronic component according to claim 1, wherein each of the first and second metal terminals includes a terminal body and at least two plated films arranged over a surface of the terminal body.

17. The ceramic electronic component according to claim 8, further comprising non-plated portions in which no plated films are present, are provided in peripheral portions of the extending portion and the mounting portion of the first and second metal terminals.

18. The ceramic electronic component according to claim 17, wherein surfaces of terminal bodies of the first and second metal terminals are exposed at the non-plated portions.

19. The ceramic electronic component according to claim 1, wherein the bare ceramic body is defined by one of a dielectric ceramic, a piezoelectric ceramic, a semiconductor ceramic and a magnetic ceramic.

20. The ceramic electronic component according to claim 1, wherein the ceramic electronic component is one of a capacitor, a piezoelectric component, a thermistor, and an inductor.

* * * * *